(12) United States Patent
Chung

(10) Patent No.: US 8,410,518 B2
(45) Date of Patent: Apr. 2, 2013

(54) ORGANIC LIGHT EMITTING DIODE DISPLAY AND METHOD FOR MANUFACTURING THE SAME

(75) Inventor: Yun-Ah Chung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/315,062

(22) Filed: Dec. 8, 2011

(65) Prior Publication Data
US 2012/0313136 A1    Dec. 13, 2012

(30) Foreign Application Priority Data
Jun. 10, 2011    (KR) .................. 10-2011-0056286

(51) Int. Cl.
*H01L 33/00* (2010.01)
(52) U.S. Cl. ...................................... 257/100
(58) Field of Classification Search .............. 257/100, 257/80, 88, 99, 40, 642–643, 759, E51.001–E51.052, 257/E25.008–E25.009, E33.059, E21.503; 438/29, 69, 82, 99, 28
See application file for complete search history.

(56) References Cited

U.S. PATENT DOCUMENTS

| | | | |
|---|---|---|---|
| 2005/0280012 A1* | 12/2005 | Boettiger et al. | 257/88 |
| 2005/0285521 A1* | 12/2005 | Menda | 313/512 |
| 2011/0095276 A1* | 4/2011 | Imai et al. | 257/40 |
| 2012/0061653 A1* | 3/2012 | Yamazaki et al. | 257/40 |
| 2012/0267676 A1* | 10/2012 | Satake | 257/99 |

FOREIGN PATENT DOCUMENTS

| | | |
|---|---|---|
| JP | 2004-022359 A | 1/2004 |
| JP | 2005-339863 A | 12/2005 |
| KR | 10-2004-0039608 A | 5/2004 |
| KR | 10-2005-0122302 A | 12/2005 |

OTHER PUBLICATIONS

Poirier et al., "The Self-Assembly Mechanism of Alkanethiols on Au(111)," *Science*, May 24, 1996, 272(5265):1145-1148.

* cited by examiner

*Primary Examiner* — Dao H Nguyen
*Assistant Examiner* — Tram H Nguyen
(74) *Attorney, Agent, or Firm* — Knobbe Martens Olson & Bear, LLP

(57) ABSTRACT

In one aspect, an organic light emitting diode (OLED) display that includes: a substrate; an organic light emitting element on the substrate; a thin film encapsulation layer on the substrate and covering the organic light emitting element; a polymer carpet layer directly on the thin film encapsulation layer; and a cover film directly on the polymer carpet layer is provided.

12 Claims, 5 Drawing Sheets

ORGANIC LIGHT EMITTING DIODE DISPLAY AND METHOD FOR MANUFACTURING THE SAME

CROSS-REFERENCE TO RELATED APPLICATIONS

This application claims priority to and the benefit of Korean Patent Application No. 10-2011-0056286 filed in the Korean Intellectual Property Office on Jun. 10, 2011, the entire contents of which are incorporated herein by reference.

BACKGROUND

1. Field

The present disclosure relates generally to an organic light emitting diode (OLED) display and a manufacturing method thereof. More particularly, the described technology relates generally to an organic light emitting diode (OLED) display and a manufacturing method thereof in which an impact resistance property is improved.

2. Description of the Related Technology

An organic light emitting diode (OLED) display has a self-emissive characteristic, and thus, unlike a liquid crystal display, does not need a separate light source to illuminate the display. In addition, since the OLED display has high-quality characteristics such as low power consumption, high luminance, fast reaction time, and the like, the OLED display is finding utility as a display device for portable electronic devices.

An organic light emitting diode (OLED) display includes a plurality of organic light emitting elements (organic light emitting diodes) having a hole injection electrode, an organic emission layer, and an electron injection electrode. Light emission occurs by energy that is generated when excitons that are generated by coupling of electrons and holes within an organic emission layer drop from an exited state to a ground state, whereby the OLED display displays an image.

However, the organic emission layer can be sensitive to an external environment such as moisture or oxygen. Accordingly, if the organic emission layer can be exposed to moisture and oxygen, the quality of the organic light emitting diode (OLED) display can be deteriorated. Therefore, to protect the organic light emitting element and to prevent the moisture or oxygen from penetrating into the organic emission layer, an encapsulation substrate can be sealed and combined with the substrate formed with the organic light emitting element through a sealing process, or a thin film encapsulation layer can be formed on the organic light emitting element.

Particularly, if a thin film encapsulation layer is used, there is a benefit of reducing an entire thickness of the organic light emitting diode (OLED) display compared with using an encapsulation substrate.

However, the organic light emitting diode (OLED) display including the thin film encapsulation layer can be weak with regard to an external impact.

The above information disclosed in the Background section is only for enhancement of understanding of the described technology. This information is not an admission of what is know in the prior art.

SUMMARY

An exemplary embodiment provides an organic light emitting diode (OLED) display and a manufacturing method thereof that improves mechanical strength.

According to an exemplary embodiment, an organic light emitting diode (OLED) display includes: a substrate; an organic light emitting element on the substrate; a thin film encapsulation layer on the substrate and covering the organic light emitting element; a polymer carpet layer directly on the thin film encapsulation layer, wherein the polymer carpet layer is formed by a polymerization reaction of a cross-linked biphenyl self-assembled mono-layer (SAM) and silicon (Si); and a cover film directly on the polymer carpet layer.

In some embodiments, the polymer carpet layer may comprise a plurality of substantially irregularly shaped strands. For example, the polymer carpet layer may have a tangled hair shape.

In some embodiments, one surface of the thin film encapsulation layer contacting the polymer carpet layer may include silicon (Si).

In some embodiments, one surface of the cover film contacting the polymer carpet layer may have adherence.

In some embodiments, the cover film may be made of an epoxy-based material.

Some embodiments provide a manufacturing method of an organic light emitting diode (OLED) display. In some embodiments, the manufacturing method includes: forming an organic light emitting element and a thin film encapsulation layer covering the organic light emitting element and including silicon (Si) on a substrate; coating a monomer on a gold substrate and irradiating electrons to form a cross-linked biphenyl self-assembled mono-layer (SAM); detecting the cross-linked biphenyl self-assembled mono-layer in a state of being adhered to the cover film from the gold substrate by using a cover film having one surface having adherence; disposing the cross-linked biphenyl self-assembled mono-layer adhered to the cover film to contact the thin film encapsulation layer; and irradiating ultraviolet (UV) to the cross-linked biphenyl self-assembled mono-layer in a state of contacting the thin film encapsulation layer to polymerize the cross-linked biphenyl self-assembled mono-layer and silicon included in the thin film encapsulation layer, thereby forming a polymer carpet layer.

In some embodiments, the polymer carpet layer may comprise a plurality of substantially irregularly shaped strands. For example, the polymer carpet layer may have a tangled hair shape.

In some embodiments, the monomer may include a para-nitrobiphenyl.

In some embodiments, the thin film encapsulation layer may include a silicon oxide layer or a silicon nitride layer.

In some embodiments, the cover film may be made of an epoxy-based material.

In some embodiments, the cross-linked biphenyl self-assembled mono-layer detached from the gold substrate may have a thickness in the range of 0.5 nm to 2 nm.

In some embodiments, the organic light emitting diode display may have improved mechanical strength.

In some embodiments, an organic light emitting diode (OLED) display as described herein may be effectively manufactured.

DETAILED DESCRIPTION

Figure 1:
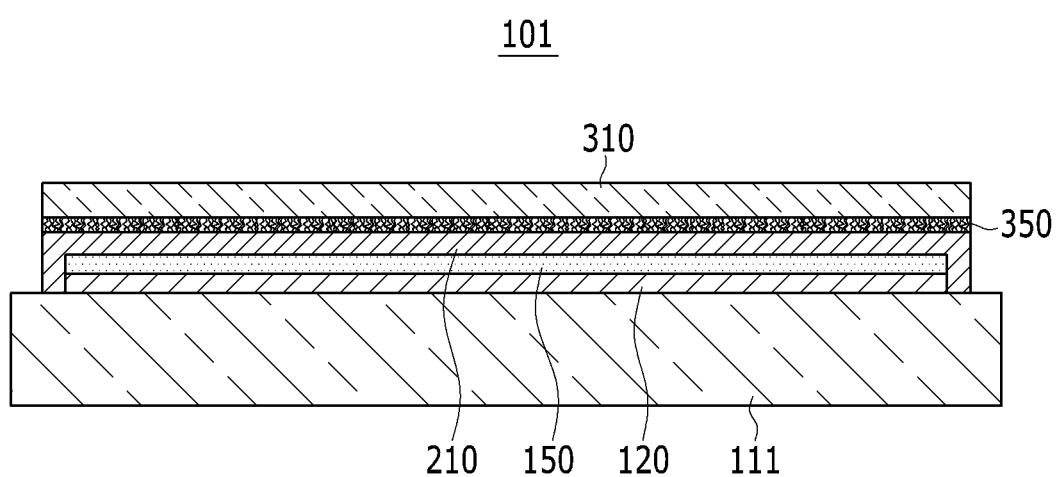
FIG. 1 is a cross-sectional view of an organic light emitting diode (OLED) display according to one embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the parts may be omitted for clarity Like reference numerals designate like elements throughout the specification.

In addition, the size and thickness of each component shown in the drawings are arbitrarily shown for understanding and ease of description, but the present embodiments are not limited thereto. Therefore, an exemplary embodiment is not restrictive to the illustration. It will be understood that when an element such as a layer, film, region, or substrate is referred to as being "on" another element, it can be directly on the other element or intervening elements may also be present.

An organic light emitting diode (OLED) display 101 according to an exemplary embodiment will be described with reference to FIG. 1.

As shown in FIG. 1, an organic light emitting diode (OLED) display 101 according to an exemplary embodiment includes a substrate 111, a driving circuit unit 120, an organic light emitting element 150, a thin film encapsulation layer 210, a polymer carpet layer 350, and a cover film 310.

In some embodiments, the substrate 111 can be formed with a transparent insulating substrate made of glass, quartz, or ceramic.

In some embodiments, the driving circuit unit 120 can be formed on the display substrate 111. In some embodiments, the driving circuit unit 120 can include circuit elements including a plurality of thin film transistors and capacitors, and drives the organic light emitting element 150.

In some embodiments, the organic light emitting element 150 can be formed on the display substrate 111, and can be electrically connected to the driving circuit unit 120. In some embodiments, the organic light emitting element 150 emits light according to a driving signal transmitted from the driving circuit unit 120. Here, the organic light emitting element 120 may be divided into a light emitting region actually emitting light and a non-light emitting region near the light emitting region.

In some embodiments, the driving circuit unit 120 and the organic light emitting element 150 may be formed with various structures known by those of skill in the art.

In some embodiments, the thin film encapsulation layer 210 can cover the organic light emitting element 150 to be protected. In some embodiments, the thin film encapsulation layer 210 includes at least one of an organic layer and an inorganic layer. If at least one of the organic layer at least one of the inorganic layer are alternately deposited to form the thin film encapsulation layer 210, merits and drawbacks of the organic layer and the inorganic layer may be compensated. In detail, the inorganic layer has an excellent moister penetration suppression force compared with the organic layer, and the organic layer has an excellent flatness characteristic and reduces stress between layers. For example, the entire thickness of the thin film encapsulation layer 210 may be in the range of 1 nm to 1000 nm.

In an exemplary embodiment, the highest layer of the thin film encapsulation layer 210 can include silicon (Si). In detail, the highest layer of the thin film encapsulation layer 210 may be a silicon oxide ($SiO_2$) layer or a silicon nitride (SiNx) layer.

Figure 2:
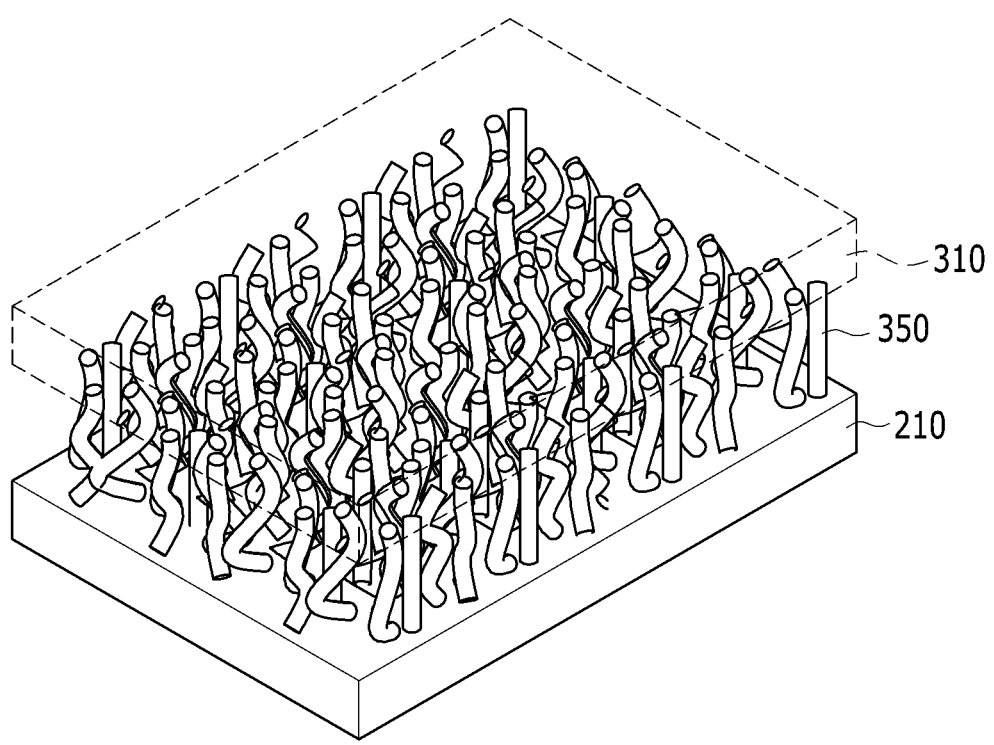
FIG. 2 is an enlarged perspective view of a portion of the polymer carpet layer shown in FIG. 1.

In some embodiments, the polymer carpet layer 350 can be formed directly on the thin film encapsulation layer 210. As shown in FIG. 2, the polymer carpet layer 350 can be a structure formed with a plurality of substantially irregularly shaped strands. In some embodiments, the plurality of substantially irregularly shaped strands can have a tangled hair shape. That is, the polymer carpet layer 350 may effectively execute a smoothing function while absorbing an impact such as a cushion.

In some embodiments, the polymer carpet layer 350 can be formed by a polymerization reaction of a biphenyl self-assembled mono-layer (SAM) and silicon (Si) that are cross-linked. In some embodiments, the polymerization reaction can be generated through ultraviolet (UV) irradiation, and the silicon included in the thin film encapsulation layer 210 can be involved in the polymerization reaction.

In some embodiments, the cover film 310 can be formed on the polymer carpet layer 350. For example, the cover film 310 may be made of an epoxy-based material. Also, one surface of the cover film 310 contacting the polymer carpet layer 350 may have adherence.

The cover film 310 not only protects the polymer carpet layer 350, but also helps the polymer carpet layer 350 to be effectively formed.

By this configuration, the organic light emitting diode (OLED) display 101 according to an exemplary embodiment may have an excellent impact resistance property by simultaneously improving the mechanical strength while having a relatively thin thickness through the thin film encapsulation layer 210.

A manufacturing method of an organic light emitting diode (OLED) display according to an exemplary embodiment will be described with reference to FIG. 3 to FIG. 5.

Figure 3:
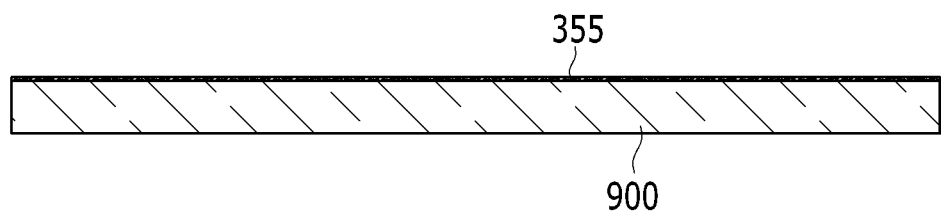
FIG. 3 to FIG. 5 are cross-sectional views sequentially showing a manufacturing method of the organic light emitting diode (OLED) display of FIG. 1.

In some embodiments, a monomer (not shown) can be coated on a substrate 900 made of gold, as shown in FIG. 3. For example, the monomer may include para-nitrobiphenyl. Also, electrons can be irradiated to the monomer to form a cross-linked biphenyl self-assembled mono-layer (SAM) 355.

Figure 4:
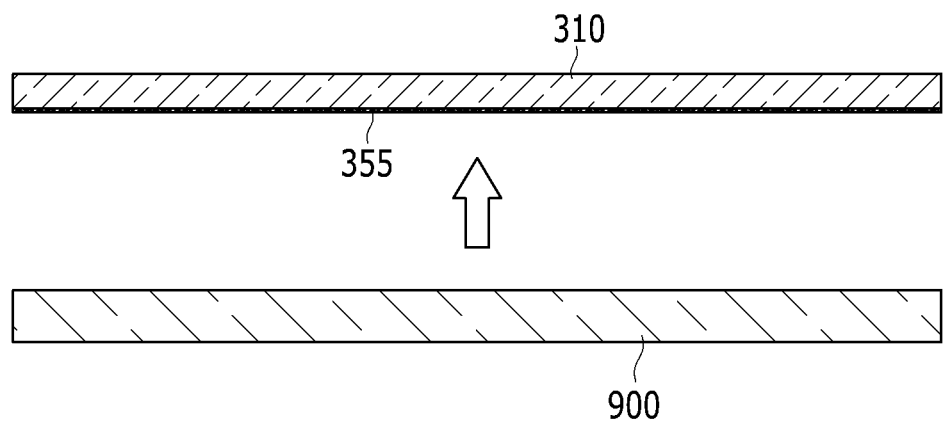

In some embodiments, the cross-linked biphenyl self assembled mono-layer 355 can be detached from the gold substrate 900 by using the cover film 310, as shown in FIG. 4. One surface of the cover film 310 may have adherence. As described above, one surface of the cover film 310 having adherence can be attached to the cross-linked biphenyl self assembled mono-layer 355 to be detached from the gold substrate 900. Here, the cross-linked biphenyl self assembled mono-layer 355 detached from the cover film 310 may have a thickness in a range of 0.5 nm to 2 nm. In some embodiments, the cross-linked biphenyl self assembled mono-layer 355 detached from the cover film 310 may have a thickness of about 1 nm.

In some embodiments, the cover film 310 can be made of an epoxy-based material, thereby being a member that protects the cross-linked biphenyl self-assembled mono-layer 355.

Figure 5:
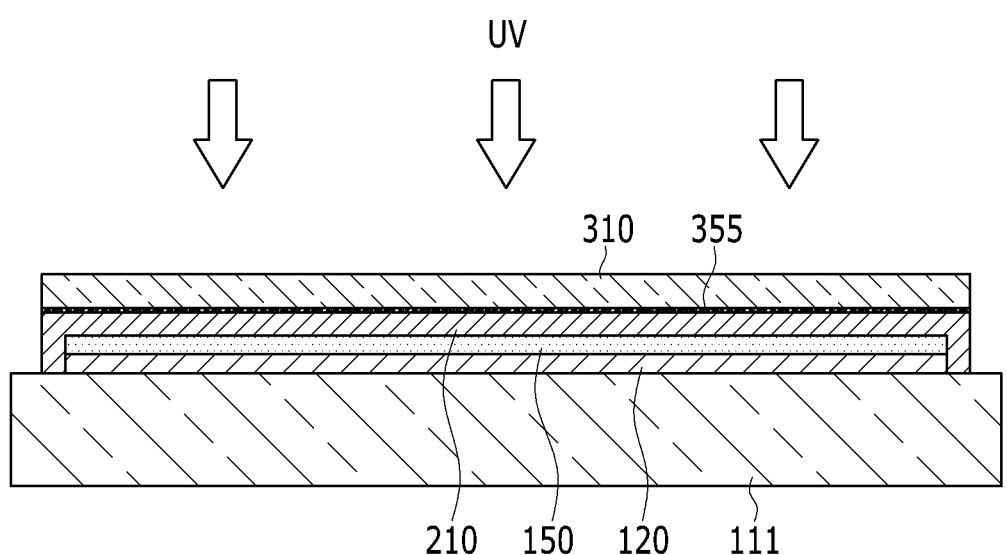

In some embodiments, a thin film encapsulation layer 150 covering the organic light emitting element 120 and the organic light emitting element 120 and including silicon (Si) can be formed on the substrate 111, as shown in FIG. 5. In some embodiments, the biphenyl self-assembled mono-layer 355 cross-linked with the cover film 310 in an adhesion state can be disposed to contact the thin film encapsulation layer 210. In some embodiments, the thin film encapsulation layer 210 contacting the cross-linked biphenyl self-assembled mono-layer 355 can include silicon such as silicon oxide or silicon nitride.

In some embodiments, the cross-linked biphenyl self-assembled mono-layer 355 contacting the thin film encapsulation layer 210 can be polymerized with ultraviolet (UV) light. In some embodiments, the cross-linked biphenyl self-assembled mono-layer 355 irradiated with ultraviolet (UV) light can be polymerized with silicon included in the thin film encapsulation layer 210, and as shown in FIG. 2, forming a polymer carpet layer having a tangled hair shape. As shown in FIG. 1, the organic light emitting diode (OLED) display 101 can be completed by this process.

An organic light emitting diode (OLED) display 101 having excellent impact resistance property may be manufactured by improving the mechanical strength through the polymer carpet layer 350 simultaneously having the cushion function while having the thin thickness by using the thin film encapsulation layer 210 by the above manufacturing method.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF DRAWING SYMBOLS

101: organic light emitting diode (OLED) display
120: driving circuit unit
150: organic light emitting element
210: thin film encapsulation layer
310: cover film
350: polymer carpet layer

What is claimed is:

1. An organic light emitting diode (OLED) display comprising:
    a substrate;
    an organic light emitting element on the substrate;
    a thin film encapsulation layer on the substrate and covering the organic light emitting element;
    a polymer carpet layer directly on the thin film encapsulation layer, wherein the polymer carpet layer is formed by a polymerization reaction of a cross-linked biphenyl self-assembled mono-layer (SAM) and silicon (Si); and
    a cover film directly on the polymer carpet layer.

2. The organic light emitting diode (OLED) display of claim 1, wherein the polymer carpet layer comprises a plurality of substantially irregularly shaped strands.

3. The organic light emitting diode (OLED) display of claim 2, wherein the plurality of substantially irregularly shaped strands has a tangled hair shape.

4. The organic light emitting diode (OLED) display of claim 1, wherein one surface of the thin film encapsulation layer contacting the polymer carpet layer includes silicon (Si).

5. The organic light emitting diode (OLED) display of claim 1, wherein one surface of the cover film contacting the polymer carpet layer has adherence.

6. The organic light emitting diode (OLED) display of claim 1, wherein the cover film is made of an epoxy-based material.

7. A manufacturing method of an organic light emitting diode (OLED) display, comprising:
    forming an organic light emitting element and a thin film encapsulation layer covering the organic light emitting element and including silicon (Si) on a substrate;
    coating a monomer on a gold substrate and irradiating electrons to form a cross-linked biphenyl self-assembled mono-layer (SAM);
    detecting the cross-linked biphenyl self-assembled mono-layer in a state of being adhered to the cover film from the gold substrate by using a cover film having one surface having adherence;
    disposing the cross-linked biphenyl self-assembled mono-layer adhered to the cover film to contact the thin film encapsulation layer; and
    irradiating the cross-linked biphenyl self-assembled mono-layer contacting the thin film encapsulation layer to polymerize the cross-linked biphenyl self-assembled mono-layer and silicon included in the thin film encapsulation layer with ultraviolet (UV) light, thereby forming a polymer carpet layer.

8. The manufacturing method of claim 7, wherein the polymer carpet layer forms with a tangled hair shape.

9. The manufacturing method of claim 7, wherein the monomer includes a para-nitrobiphenyl.

10. The manufacturing method of claim 7, wherein the thin film encapsulation layer includes a silicon oxide layer or a silicon nitride layer.

11. The manufacturing method of claim 7, wherein the cover film is made of an epoxy-based material.

12. The manufacturing method of claim 7, wherein the cross-linked biphenyl self-assembled mono-layer detached from the gold substrate has a thickness in the range of 0.5 nm to 2 nm.

* * * * *

UNITED STATES PATENT AND TRADEMARK OFFICE
CERTIFICATE OF CORRECTION

| | | |
|---|---|---|
| PATENT NO. | : 8,410,518 B2 | Page 1 of 1 |
| APPLICATION NO. | : 13/315062 | |
| DATED | : April 2, 2013 | |
| INVENTOR(S) | : Yun-Ah Chung | |

It is certified that error appears in the above-identified patent and that said Letters Patent is hereby corrected as shown below:

In the Specification

Column 1, Line 61, please delete "know" and insert therefore, --known--.

Column 3, Line 13, please delete "clarity" and insert therefore, --clarity.--.

Signed and Sealed this
Thirty-first Day of December, 2013

Margaret A. Focarino
*Commissioner for Patents of the United States Patent and Trademark Office*